(12) United States Patent
Fu et al.

(10) Patent No.: US 7,648,767 B2
(45) Date of Patent: Jan. 19, 2010

(54) MATERIAL COMPOSITION FOR NANO- AND MICRO-LITHOGRAPHY

(75) Inventors: Peng Fei Fu, Midland, MI (US); Lingjie Jay Guo, Ann Arbor, MI (US); Xing Cheng, Ann Arbor, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 10/598,943

(22) PCT Filed: Jun. 1, 2005

(86) PCT No.: PCT/US2005/019340

§ 371 (c)(1),
(2), (4) Date: Sep. 15, 2006

(87) PCT Pub. No.: WO2006/083284

PCT Pub. Date: Aug. 10, 2006

(65) Prior Publication Data

US 2007/0196589 A1    Aug. 23, 2007

Related U.S. Application Data

(60) Provisional application No. 60/575,953, filed on Jun. 1, 2004.

(51) Int. Cl.
  *B32B 17/06*    (2006.01)
  *C08G 59/68*    (2006.01)
(52) U.S. Cl. .................. 428/429; 522/31; 523/109; 528/13
(58) Field of Classification Search .............. 428/429; 523/109; 528/13; 522/31
  See application file for complete search history.

(56) References Cited

U.S. PATENT DOCUMENTS

2002/0137870 A1    9/2002    Crivello

FOREIGN PATENT DOCUMENTS

WO    WO9212183    7/1992
WO    WO99/26112    5/1999

OTHER PUBLICATIONS

Crivello et al., "The Synthesis, Characterization, and Photoinitiated Cationic Polymerization of Silicon-Containing Epoxy Resins" Journal of Polymer Science Polymer Chemistry Edition, 1990, vol. 28, pp. 479-503, XP 000141356.
Crivello et al., The UV Cure of Epoxy-Silicone Monomers, Polymeric Materials Science and Engineering, 1989, pp. 217-227, XP009035836.
Labianca et al., "High Aspect Ratio Resist For Thick Film Applications", Advances In Resist Technlogy and Processing XII, Spie, 1995, vol. 2438, pp. 846-852, XP002437324.
Matsui et al., "Room-temperature nanoimprint and nanotransfer printing using hydrogen silsequioxane", Journal of Vacuum Science & Technology B: Microelectronics Processing and Phenomena, American Vacuum Society, Mar. 2003, vol. 21, No. 2, pp. 688-692, XP012009826.
Pfeiffer et al., "Reactive Polymers—a Route to Nanoimprint Lithography at Low Temperatures", Proceedings of Spie, Spie, 2003, vol. 5037, pp. 203-210, XP-002297929.
Pfeiffer et al., "Multistep profiles by mix and match of nanoprint and UV lithography", Microelectronic Engineering, 2001, vol. 57-58, pp. 381-387, XP004302289.
Sun Xiaoyun et al., "Multilayer resist methods for nanoimprint lithography on nonflat surfaces", Journal of Vacuum Science & Technology B: Microelectronics Processing and Phenomena, American Vacuum Society, 1998, vol. 16, No. 6, pp. 3922-3925, XP012007311.
International Search Report, International Application No. PCT/US2005/019340, dated Jun. 29, 2007.

*Primary Examiner*—D. S Nakarani
(74) *Attorney, Agent, or Firm*—Howard & Howard Attorneys PLLC

(57) ABSTRACT

A material composition, which is used as a liquid resist, includes a first component comprising a monomer portion and at least one cationically polymerizable functional group, and a crosslinker reactive with the first component and comprising at least three cationically polymerizable functional groups. The material composition also includes a cationic photoinitiator. Upon exposure to UV light, the material composition crosslinks via cure to form a cured resist film that is the reaction product of the first component, the crosslinker, and the cationic photoinitiator. An article includes a substrate layer and a resist layer formed on the substrate layer from the material composition.

26 Claims, 3 Drawing Sheets

US 7,648,767 B2

MATERIAL COMPOSITION FOR NANO- AND MICRO-LITHOGRAPHY

RELATED APPLICATIONS

This application claims priority to and all the advantages of International Patent Application No. PCT/US2005/019340, filed on Jun. 1, 2005, which claims priority to U.S. Provisional Patent Application No. 60/575,953, filed on Jun. 1, 2004.

FIELD OF THE INVENTION

The present invention generally relates to a material composition. More specifically, the invention relates to a material composition that is used for fabricating nano- and microstructures in nano- and micro-lithography using conventional contact exposure tools or other simple equipment.

BACKGROUND OF THE INVENTION

Nanopatterning is an essential part of nanotechnology research for fabricating nanostructures. For these nanostructures and nanopatterning techniques to have significant practical value, low cost and high throughput nanopatterning techniques are indispensable. Among many new emerging techniques that are aimed at lowering cost and increasing throughput, nanoimprint lithography (NIL) is regarded as a promising technique. NIL has the capability of patterning sub-10 nm structures, yet only entail simple equipment setup and easy processing. As such, NIL has been applied in the fabrication of numerous electric and optical devices, and also in wafer-scale processing.

There are, however, obstacles that prevent NIL from being an onmnipotent solution for the requirements associated with the next generation lithography of nanostructures. Convention NIL requires high temperature and high pressure during imprinting, and such conditions are especially unsuitable for microelectronics fabrication. Step-and-Flash Imprint Lithography (S-FIL) is another technique based on mechanical imprinting but uses a UV curable liquid material as a liquid resist. With S-FIL, the liquid resist is dispensed in droplet form onto a substrate, and then a template is brought into contact with the substrate and pressed against the substrate to spread out the liquid resist thereby forming a film of the liquid resist. This film is then cured by exposure to UV light. S-FIL can be carried out at room temperature and, therefore, does not require high temperatures like conventional NIL. However, S-FIL is still not ideal because the thickness and uniformity of the resist and resultant residual layer are difficult to control because the film of the liquid resist is formed by spreading under pressure. Spreading under pressure can be inconsistent. In addition, the UV curable liquid materials used in S-FIL are typically based on a mechanism involving free radical polymerization of acrylic functional monomers and oligomers. This mechanism typically exhibits extensive shrinkage after cure and is also prone to oxygen sensitivity where oxygen scavenges free radical species thereby inhibiting polymerization at a surface of the resist which makes S-FIL prone to defect generation in the resultant nanostructure. Finally, to achieve low viscosity for low pressure imprinting, reactive monomers are usually needed and the conventional material compositions of the prior art typically rely on reactive monomers that have low molecular weights (e.g. <300 Daltons) and are, therefore, volatile and emit unpleasant odors.

Thus, there remains a need for a material composition that improves upon the conventional material compositions typically relied on in the conventional NIL and in S-FIL techniques and that can be used in nano- and micro-lithography using conventional tools and equipment at low temperature and low pressure.

SUMMARY OF THE INVENTION AND ADVANTAGES

A material composition according to the present invention includes a first component, a crosslinker, and a cationic photoinitiator. The first component comprises a monomer portion and at least one cationically polymerizable functional group. The crosslinker is reactive with the first component and comprises at least three cationically polymerizable functional groups.

Due to a low viscosity, the material composition can be used in nano- and micro-lithography using conventional tools and equipment at low temperature (e.g. room temperature) and low pressure. This material composition is also suitable for newer, unique combined nanoimprint-and-photolithography techniques. Further, the material composition of the present invention is particularly suitable to be spin-coated onto a variety of substrates where thickness and uniformity can be precisely controlled. High throughput can also be accomplished with this material composition.

BREIF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE PREFERRED EMBODIMENTS

Figure 1:
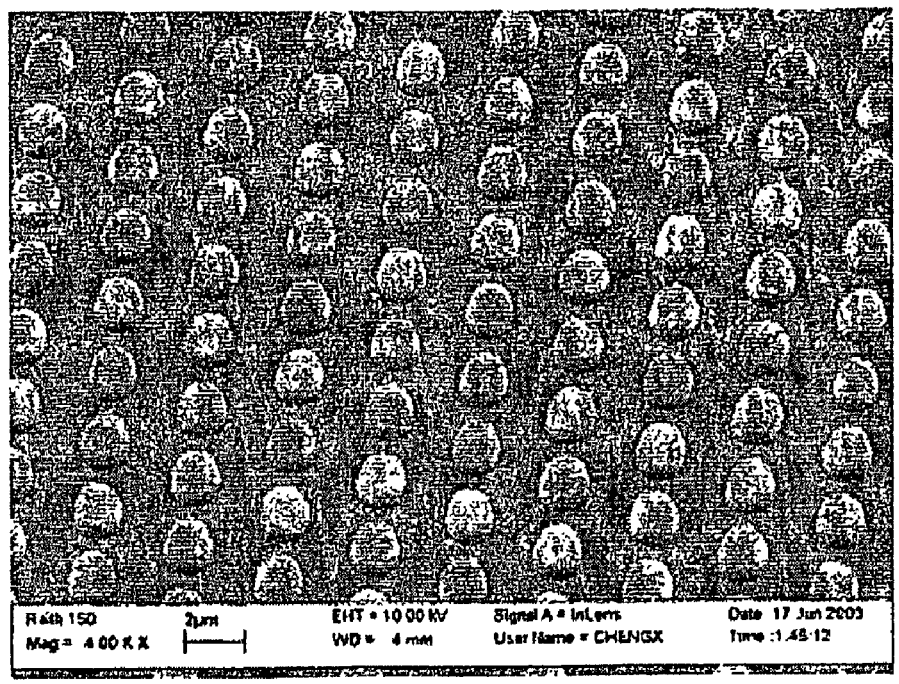
FIG. 1 is a scanning electron microscopy (SEM) micrograph illustrating 1 μm diameter protruding dot patterns achieved with the material composition of the present invention.

A material composition according to the present invention is primarily used for nano- and micro-lithography. These techniques are also referred to as nanoimprint lithography (NIL) and microimprint lithography, respectively. In these techniques, the material composition is applied to a substrate as a liquid resist, an uncured film is formed, and is then cured to form a cured resist film. The terms substrate and substrate layer are used interchangeable throughout. The cured resist film is the reaction product of the various components of the material composition. Ultimately, the material composition and the resultant cured resist film are used as a resist layer in combination with a substrate layer to form an article, such as a patterned structure on a silicon substrate or a part of an electronic or photonic microchip, for use and application in various industries.

In addition to the nano- and micro-lithography techniques, the material composition can be used in other techniques including, but not limited to, nanoscale contact printing, UV-assisted nanoimprint lithography, Step-and-Flash Nanoimprint Lithography (S-FIL), and combined-nanoimprint-and-photolithography. As such, the material composition of the present invention is frequently used in such tools as contact aligners, nanoimprinters, bonding machines, presses, and the like.

Due to the low viscosity of the material composition of the present invention, the material composition is preferably applied on the substrate, or the substrate layer, by spin-coating to form a uniform, thin, and uncured film. However, it is to be understood that the material composition may also be applied by dip-coating, spray-coating, or other appropriate coating methods known in the art. Alternatively, the material composition can be applied as liquid droplets prior to any contact printing.

As alluded to above, the low viscosity of this material composition allows imprinting with low temperature and low pressure. Use of low temperature and low pressure enables use of conventional tools and equipment, such as conventional photolithography contact aligners. Preferably, this material composition enables use of low temperatures ranging between 0 and 100° C., more preferably between 20 and 60° C., and most preferably room temperature. The preferred ranges of pressures enabled due to this material composition are less than 10 atmospheres, more preferably less than 1 atmosphere.

The material composition includes a first component, a crosslinker, and a cationic photoinitiator. As is evident from the description below, the preferred material composition is based on cationic polymerization and crosslinking of epoxy functional groups, more specifically cycloaliphatic epoxy functional groups.

The first component comprises a monomer portion and at least one cationically polymerizable functional group. The first component is preferably present in the material composition from 90-98, more preferably 94, parts by weight based on 100 parts by weight of the material composition. Generally, the first component of the material composition determines, or controls, chemical and physical properties of the cured resist film including the likes of surface energy after curing and certain mold-release characteristics after imprinting and curing. Generally, the first component is of relatively higher molecular weight and is, therefore, non-volatile.

It is preferred that the cationically polymerizable functional group of the first component is selected from the group of epoxy functional groups, vinyl ether functional groups, and combinations thereof and also that the first component comprise two cationically polymerizable functional groups. However, the first component may include more than two cationically polymerizable functional groups. The monomer portion of the first component can be an organic monomer or an organosilicone monomer. Exemplary organic monomers include, but are not limited to, aryl, such as phenyl, norbornane, and combinations thereof. On the other hand, although not required, the organosilicone monomer typically contains $(SiR_2O)$ or $(SiRO_{3/2})$ units, wherein R is hydrogen, a methyl group, a phenyl group, a hydrocarbon, or a fluorocarbon group. As evident from the chemical representation of the most preferred first component below, R is most preferably the methyl group.

A chemical representation of the most preferred first component is disclosed below.

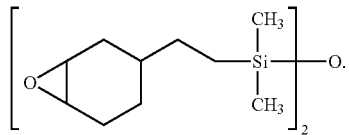

The most preferred first component disclosed above is the reaction product of 4-vinyl-1-cyclohexane-1,2-epoxide and an SiH-functional silicone compound. The most preferred first component is, generally, a low molecular weight, short chain, silicone epoxy oligomer (an epoxy functional monomer, more specifically a silicone diepoxy) that provides the cured resist film with low surface energy after curing and, therefore, suitable mold-release characteristics after imprinting and curing.

The crosslinker is reactive with the first component and comprises at least three cationically polymerizable functional groups. The crosslinker is preferably present in the material composition from 1-9, more preferably 5, parts by weight based on 100 parts by weight of the material composition. Upon cure, the crosslinker reacts with the first component, specifically with the cationically polymerizable functional group of the first component, to form a cross-linked network, i.e., the cured resist film.

Like the first component, it is also preferred that the cationically polymerizable functional group of the crosslinker is selected from the group of epoxy functional groups, vinyl ether functional groups, and combinations thereof. It is also preferred that the crosslinker comprise four cationically polymerizable functional groups. However, the crosslinker may include more than four cationically polymerizable functional groups. The crosslinker may be an organic molecule or an organosilicone-based molecule. In any event, as evident from the chemical representation of the most preferred crosslinker below, it is most preferred that the crosslinker comprise silicone.

A chemical representation of the most preferred crosslinker is disclosed below.

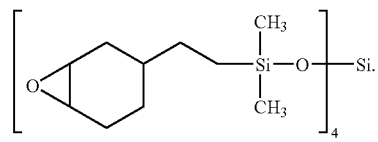

Like the first component, the most preferred crosslinker disclosed above is also the reaction product of 4-vinyl-1-cyclohexane-1,2-epoxide and an SiH-functional silicone compound. The most preferred crosslinker illustrated above is, generally, an epoxy functional crosslinker, more specifically a silicone epoxy with four cycloaliphatic epoxy groups. The silicone content in the most preferred first component and crosslinker increases dry etch resistance and also provides lower surface energy making it easier to be separated during processing after patterning, for example from a mask.

The cationic photoinitiator, sometimes also referred to as a photoacid generator, is a chemical that undergoes actinic decomposition upon exposure of UV light. Upon this decomposition, an active cationic species and an anionic species exist. Generally, the cationic species is a super strong proton ($H^+$), that is capable of inducing crosslinking between unsaturated sites of the first component and the crosslinker. Preferably, the cationic species includes an onium salt, such as a diaryliodonium salt, a triarylsulfonium salt, or a tetraaryl phosphonium salt, and the anionic species is selected from the group of $BF_4^-$, $PF_6^-$, $AsF_6^-$, $SbF_6^-$, and $(C_6F_5)_4B^-$. The cationic photoinitiator is typically present in the material composition from 0.1-2, more preferably 1, parts by weight based on 100 parts by weight of the material composition.

Upon crosslinking between the first component and the crosslinker, the cured resist is, preferably, of the general formula:

of light exposure. The adhesion promoters, such as 3-glycidoxypropyltrimethoxysilane, are utilized to improve surface adhesion of the substrate. The release agents to reduce the surface energy of the contact surfaces involved in the various techniques.

As alluded to above, the material composition as the liquid resist and the resultant cured resist film are used to form the article. The article includes the substrate layer and the resist layer. Preferably, the substrate layer is formed from silicon or glass, but the substrate layer may also be formed from metals and plastics. The resist layer is the reaction product of, i.e., is formed from, the various components (the first component, the crosslinker, and the cationic photoinitiator) of the material

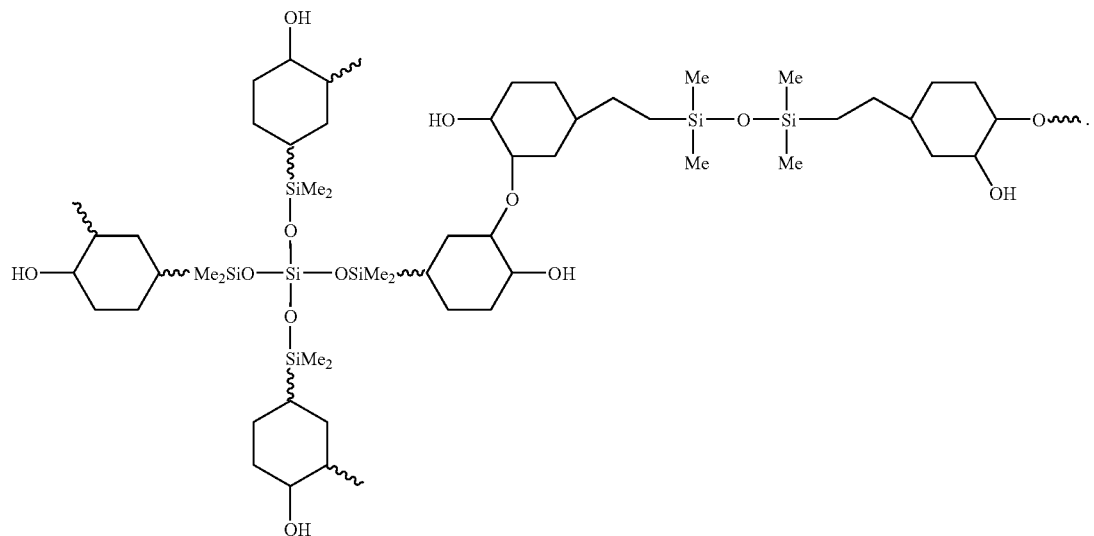

The material composition may also include a non-reactive diluent for reducing a viscosity of the material composition. Although not required, the non-reactive diluent is typically a high boiling point (>80° C.), organic solvent and is preferably selected from the group of PGMEA, PGME, 2-heptanone, xylene, and combinations thereof. The viscosity of the material composition of the present invention is low in that it can be adequately applied by spin-coating and, preferably, the material composition has a kinematic viscosity that ranges from 1 to 10,000, more preferably from 10 to 1,000, and most preferably from 50 to 200, centistokes (cSt) at room temperature (approximately 20° C.). A lower viscosity of the material composition helps achieve a thinner film of the material composition, i.e., of the liquid resist. Varying the amount of the non-reactive diluent relative to the amount of the other components of the material composition (the first component, the crosslinker, and the cationic photoinitiator), assists in controlling the thickness of the uncured film and, ultimately, the cured resist film. This thickness may range from sub-100 nm to several microns.

The material composition may also include an additive to modify, as necessary, desired physical and chemical properties. Additives typically do not integrate into the crosslinked network and are typically used in relatively small amounts. If included, such additives include, but are not limited to, those selected from the group of stabilizers, adhesion promoters, mold release agents, and combinations thereof. Stabilizers are used to prevent gelation of the material composition in storage and premature curing, once applied, due to low levels composition. Technically, the resist layer is formed on the substrate layer. More specifically, an undercoating layer is disposed between the substrate layer and the resist layer. As such, in more detail, the undercoating layer is formed on the substrate layer and the resist layer is formed on the undercoating layer. The undercoating layer is formed from a polymer. One example of a suitable polymer is poly(methyl methacrylate) (PMMA). However, other polymers including, but not limited to, polystyrene and polysilsesquioxanes, are suitable so long as the polymer is soluble in an organic solvent. Preferably, the polymer is an amorphous polymer with a Tg greater than 30° C. The undercoating layer formed from the polymer is used for better wetting of the substrate layer by the material composition, i.e., the liquid resist, during spin-coating of the material composition onto the substrate layer. The better wetting of the substrate layer ensures film uniformity. Because the polymer which forms the undercoating layer can be removed by common organic solvents, such as acetone, the undercoating layer may also be used as a sacrificial layer in a lift-off fabrication process known to those skilled in the art.

Because cationic polymerization is not oxygen inhibited, the material composition of the present invention is oxygen insensitive and generates fewer defects when used as a UV curable liquid resist. In addition, the shrinkage of the cycloaliphatic epoxies after curing is known to be low as compared with the free radical polymerization of acrylic functional monomers and oligomers. The low shrinkage with the present invention provides several advantages as a resist. One example is that mold patterns can be accurately and faithfully replicated. Also, it is known that shrinking after curing tends to cause the cured resist film to delaminate from the substrate, especially on certain substrates such as metal and plastics. Therefore, low shrinkage can ensure better film adhesion of the cured resist films on such substrates.

EXAMPLES

A material composition according to the present invention was loaded and mixed. More specifically, 94 parts by weight of the first component, 5 parts by weight of the crosslinker, and 1 part by weight of the cationic photoinitiator were loaded and mixed with a conventional mixer. All parts by weight are based on 100 parts by weight of the material composition.

Figure 2:
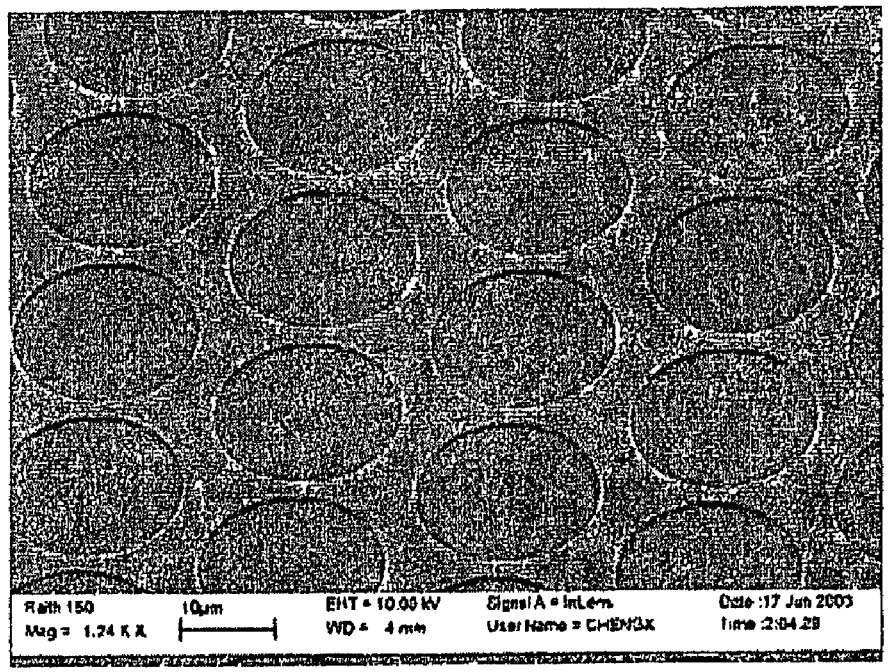
FIG. 2 is an SEM micrograph illustrating 20 μm diameter recessed circular patterns achieved with the material composition of the present invention.
Figure 3:
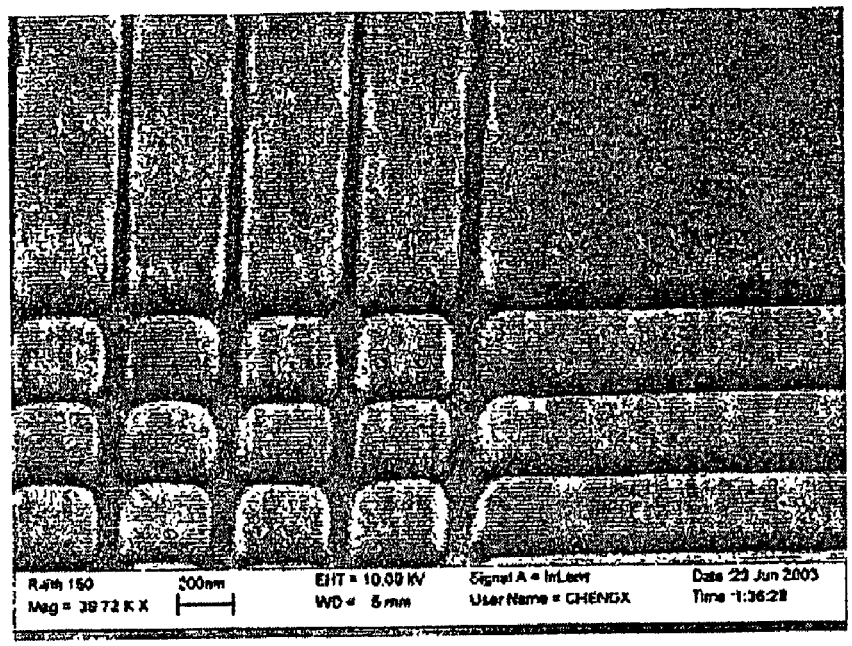
FIG. 3 is an SEM micrograph illustrating sub-100 nm (approximately 50 nm) gap or trench patterns achieved with the material composition of the present invention.
Figure 4:
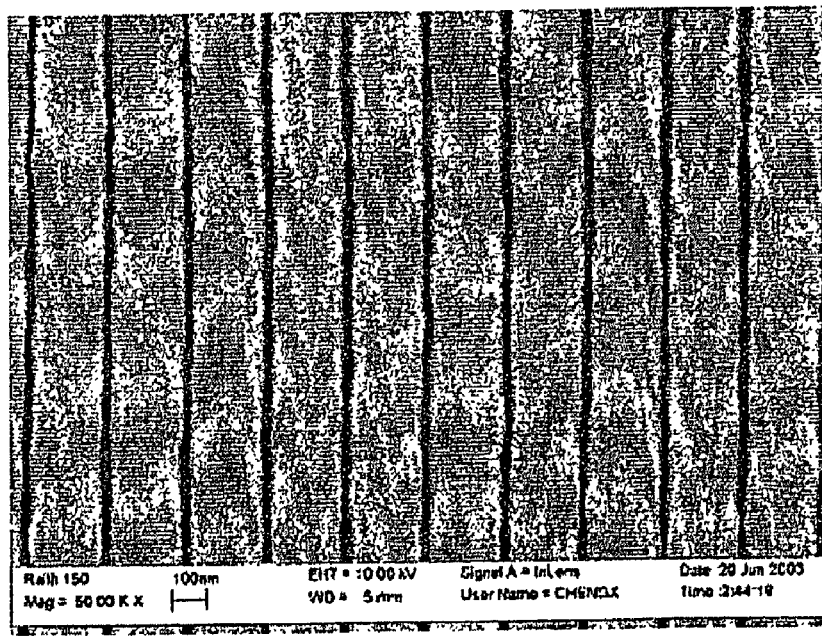
FIG. 4 is an SEM micrograph illustrating approximately 20 nm gap or trench patterns achieved with the material composition of the present invention.
Figure 5:
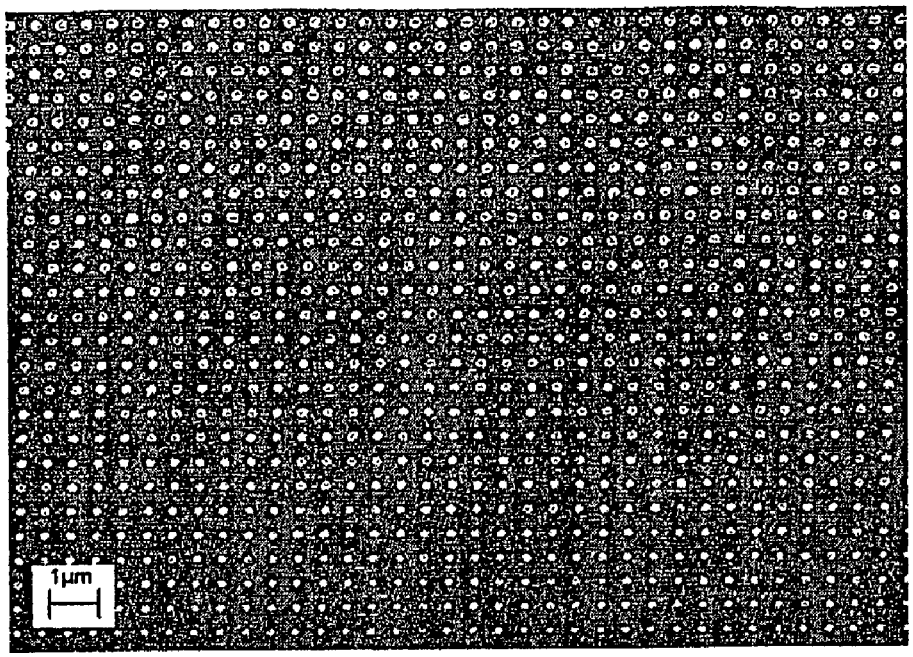
FIG. 5 is an SEM micrograph illustrating 50 to 100 nm diameter hole arrays achieved with the material composition of the present invention.
Figure 6:
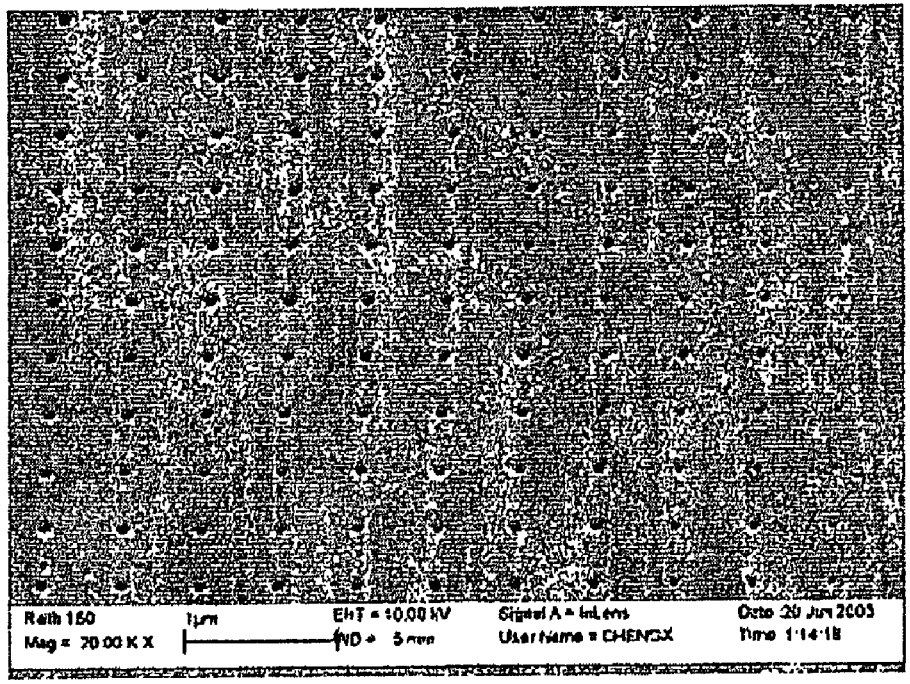
FIG. 6 is an SEM micrograph illustrating gold (Au) nanodot arrays produced by a lift-off process.

The material composition was then spin-coated, as described below in reference to "Film Preparation", to produce various nano- and micron-scale patterns. The various nano- and micron-scale patterns demonstrated with this material composition used a conventional contact aligner and UV curing conducted at a wavelength of 365 nm. Scanning electron microscopy (SEM) micrographs of these exemplary patterns are illustrated in FIGS. 1-6.

Film Preparation

Before nanoimprinting, a thin film of the material composition was spin-coated on a silicon substrate. Due to the high interfacial surface energy between epoxy functional silicone resists and substrates, film dewetting will typically occur during spin-coating, especially for thin films, as described above. To overcome this problem in the Examples of the present invention, PMMA as the polymer, dissolved in toluene as the organic solvent, was first spin-coated onto the silicon substrate as the undercoating layer. As alluded to above, this undercoating layer proves to be very effective in preventing the dewetting thereby enabling achievement of a uniform film with thicknesses ranging from microns to sub-100 nm.

Results

Since the resist is a low viscosity liquid, i.e., the material composition, spin-coated on the substrate before curing, nanoimprinting the material composition of the invention only required low pressure at relatively low temperature (less than 100° C.). The pressure required was very low (less than 1 atmosphere). This enabled nano-patterning using conventional photolithography contact aligners. The molds were made from a material transparent to UV light. This material was fused silica. After imprinting and UV flood exposure and heat treatment, the mold and the substrate were separated and a replica of the mold pattern was imprinted into the resist (see, for example, FIGS. 1-6). After removing the residual layers in the recessed pattern region, a lift-off process is carried out.

Other Properties

Film Shrinkage: It is commonly observed that polymerization induced shrinkage can occur during the liquid to solid state phase transition. Among all the UV curable systems based on different chemistries, epoxy based cationic curing like that involved with the material composition of the present invention shows the lowest shrinkage. The film shrinkage of our formulation is assessed by measuring the film thickness change before and after curing with an ellipsometer. No more than 3% of shrinkage is observed, which is consistent with the general consensus on epoxy material. Our measurement shows that the average film shrinkage is 2%.

Oxygen Reactive Ion Etching (RIE) Property: Due to the silicon component in the film, the cured resist shows very interesting oxygen RIE etching properties. For example, with the current material, a 20 nm layer is removed for the first 3 minutes of etching; but no more etching of the film is observed afterwards. This is due to the formation of silicon oxide on the top layer of the film after the oxygen plasma etching treatment, which acts as a hard mask to shield the inner part of the film from being attacked by oxygen plasma. This property is very useful because it will impart the film with much higher etching selectivity than common organic based nanoimprint resists, such as PMMA and PS. It also removes the constraint of the thickness of the undercoating layer.

The invention has been described in an illustrative manner, and it is to be understood that the terminology which has been used is intended to be in the nature of words of description rather than of limitation. Obviously, many modifications and variations of the present invention are possible in view of the above teachings. It is, therefore, to be understood that within the scope of the claims the invention may be practiced otherwise than as specifically described.

What is claimed is:

1. An article comprising:
   a substrate layer;
   a resist layer formed on said substrate layer and comprising the reaction product of a material composition comprising:
      a first component comprising a monomer portion and at least one cationically polymerizable functional group;
      a crosslinker reactive with said first component and comprising at least three cationically polymerizable functional groups; and
      a cationic photoinitiator; and
   an undercoating layer disposed between said substrate layer and said resist layer.

2. An article as set forth in claim 1 wherein said first component comprises two cationically polymerizable functional groups.

3. An article as set forth in claim 1 wherein said monomer portion of said first component is an organic monomer selected from the group of aryl, norbornane, and combinations thereof.

4. An article as set forth in claim 1 wherein said monomer portion of said first component is an organosilicone monomer containing $(SiR_2O)$ or $(SiRO_{3/2})$ units, wherein R is hydrogen, a methyl group, a phenyl group, a hydrocarbon, or a fluorocarbon group.

5. An article as set forth in claim 1 wherein said cationically polymerizable functional group of said first component is selected from the group of epoxy functional groups, vinyl ether functional groups, and combinations thereof.

6. An article as set forth in claim 1 wherein said first component is

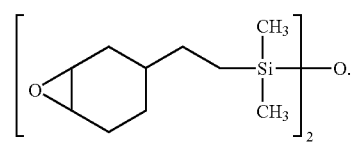

7. An article as set forth in claim 1 wherein said crosslinker comprises four cationically polymerizable functional groups.

8. An article as set forth in claim 1 wherein said crosslinker comprises silicone.

9. An article as set forth in claim 1 wherein said cationically polymerizable function groups of said crosslinker are selected from the group of epoxy functional groups, vinyl ether functional groups, and combinations thereof.

10. An article as set forth in claim 1 wherein said crosslinker is

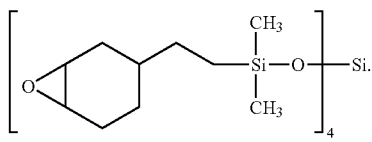

11. An article as set forth in claim 1 wherein first component and/or said crosslinker are the reaction product of 4-vinyl-1-cyclohexane-1,2-epoxide and an SiH-functional silicone compound.

12. An article as set forth in claim 1 wherein said cationic photoinitiator comprises an active cationic species and an anionic species, with said cationic species comprising an onium salt.

13. An article as set forth in claim 12 wherein said onium salt is a diaryliodonium salt, a triarylsulfonium salt, or a tetraaryl phosphonium salt and said anionic species is selected from the group of $BF_4^-$, $PF_6^-$, $AsF_6^-$, $SbF_6^-$, and $(C_6F_5)_4B^-$.

14. An article as set forth in claim 1 wherein said first component is present from 90-98 parts by weight, said crosslinker is present from 1-9 parts by weight, and said cationic photoinitiator is present from 0.1-2 parts by weight, all based on 100 parts by weight of said material composition.

15. An article as set forth in claim 1 further comprising a non-reactive diluent for reducing a viscosity of said material composition.

16. An article as set forth in claim 1 wherein;
said first component comprises two epoxy functional groups and said monomer portion of said first component is an organosilicone monomer; and
said crosslinker comprises silicone and four epoxy functional groups.

17. An article as set forth in claim 1 wherein said composition is applied on a substrate to form a film by spin-coating, dip-coating, or spray-coating.

18. An article as set forth in claim 1 wherein said composition is applied on a substrate as liquid droplets prior to contact printing.

19. An article as set forth in claim 1 wherein said resist film is of the general formula;

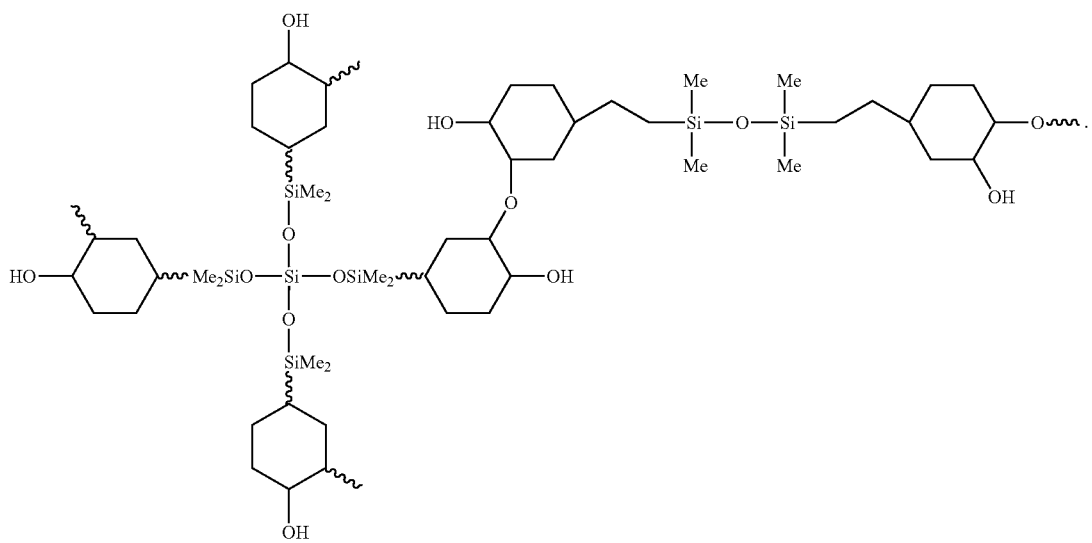

20. An article as set forth in claim 1 wherein said substrate layer is formed from silicon or glass.

21. An article as set forth in claim 1 wherein said undercoating layer is formed from a polymer.

22. An article as set forth in claim 21 wherein said polymer comprises poly(methyl methacrylate).

23. A material composition comprising:
a first component having a monomer portion and at least one cationically polymerizable functional group;
a crosslinker reactive with said first component and comprising at least three cationically polymerizable functional groups;
a cationic photoinitiator; and
a non-reactive diluent for reducing a viscosity of said material composition wherein said non-reactive diluent is selected from the group of propylene glycol monomethyl ether acetate, propylene glycol monomethyl ether, 2-heptanone, xylene, and combinations thereof.

24. A method comprising the step of imprinting a material composition comprising:
a first component having a monomer portion and at least one cationically polymerizable functional group;
a crosslinker reactive with said first component and comprising at least three cationically polymerizable functional groups; and
a cationic photoinitiator,
through at least one of nanoscale contact printing, nanoimprint lithography (NIL), microimprint lithography, UV-assisted nanoimprint lithography, Step-and-Flash Nanoimprint Lithography (S-FIL), and combined-nanoimprint-and-photolithography.

25. A method as set forth in claim 24 wherein a tool selected from the group of contact aligners, nanoimprinters, bonding machines, and presses is used for the step of imprinting.

26. A method as set forth in claim 24 wherein the material is imprinted at temperatures between 0 and 100° C. and/or at pressures less than 10 atmospheres.

* * * * *

UNITED STATES PATENT AND TRADEMARK OFFICE
CERTIFICATE OF CORRECTION

PATENT NO. : 7,648,767 B2 Page 1 of 1
APPLICATION NO. : 10/598943
DATED : January 19, 2010
INVENTOR(S) : Peng Fei Fu et al.

It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 706 days.

Signed and Sealed this

Fifteenth Day of June, 2010

David J. Kappos
*Director of the United States Patent and Trademark Office*